United States Patent [19]
Choi et al.

[11] Patent Number: 5,990,514
[45] Date of Patent: Nov. 23, 1999

[54] NONVOLATILE SEMICONDUCTOR MEMORY HAVING BOOSTING LINES SELF-ALIGNED WITH WORD LINES

[75] Inventors: Jung-Dal Choi; Sung-Tae Ahn, both of Kyonggi-do, Rep. of Korea

[73] Assignee: Samsung Electronics Co., Ltd., Rep. of Korea

[21] Appl. No.: 09/165,974

[22] Filed: Oct. 2, 1998

[30] Foreign Application Priority Data

Oct. 4, 1997 [KR] Rep. of Korea ................. 97-51108

[51] Int. Cl.$^6$ ................................. H01L 29/788
[52] U.S. Cl. .................... 257/315; 257/316; 257/319; 257/320
[58] Field of Search ................................. 257/315, 316, 257/319, 320; 438/257, 266

[56] References Cited

U.S. PATENT DOCUMENTS

| 5,859,454 | 1/1999 | Choi et al. ............................ 257/316 |
| 5,877,980 | 3/1999 | Mang et al. ...................... 365/185.17 |

FOREIGN PATENT DOCUMENTS

| 5-226664 | 9/1993 | Japan ................................. 257/315 |

OTHER PUBLICATIONS

Choi, J.D., et al. A Novel Booster Plate Technology in High Density NAND Flash Memories for Voltage Scaling–Down and Zero Program Disturbance, 1996 Symposium on VLSI Technology, Digest of Technical Papers, Jun. 1996, pp.238–239.

*Primary Examiner*—Minh Loan Tran
*Assistant Examiner*—Thien Fuong Tran
*Attorney, Agent, or Firm*—Lappin & Kusmer LLP

[57] ABSTRACT

A nonvolatile semiconductor memory device includes a plurality of floating gate type memory cell transistors having control gates. Word lines are integrally formed with the control gates, and boosting lines are self-aligned with the word lines. During programming, a first voltage is applied to a selected word line, and then a second voltage is applied to the boosting line over the selected word line. The voltage on the selected word line is then increased by capacitive coupling of the second voltage thereon, thereby programming at least one selected memory cell transistor. Therefore, a voltage lower than a program voltage is used on a selected word line, thereby reducing chip area and enhancing programming speed.

9 Claims, 14 Drawing Sheets

NONVOLATILE SEMICONDUCTOR MEMORY HAVING BOOSTING LINES SELF-ALIGNED WITH WORD LINES

BACKGROUND OF THE INVENTION

Field of the Invention

The present invention relates generally to nonvolatile semiconductor memories, and more particularly the invention relates to nonvolatile semiconductor memories having boosting lines self-aligned with underlying word lines.

Nonvolatile semiconductor memories, i.e., flash memories, such as flash electrically erasable/programmable read only memories (hereinafter referred to as EPROMs or EEPROMs), have been developed for use as high-density memory media in devices such as portable terminals, digital cameras, portable computer cards and the like. It would be desirable to reduce the manufacturing cost per bit and operational power consumption in those high-density memory media. It is particularly important to reduce the power consumption since a large amount of data, for example, at least a block data, is erased/programmed at one time in flash memories.

Conventional flash memories typically include a charge pump circuit, i.e., a voltage multiplier circuit, which is used to generate a program voltage higher than a power supply voltage during its programming operation. Reducing the program voltage can be a major factor in reducing the chip area and the power consumption.

A typical memory cell includes a transistor comprising drain and source regions on one surface of a semiconductor substrate with a channel region therebetween. A floating gate is formed over the channel region through a gate oxide layer, and a control gate is formed over the floating gate through a dielectric layer. Two approaches have been used to erase/program the memory cell transistor. One approach is a hot electron injection approach in which hot electrons accelerated by a potential applied across the drain and source regions are injected into the floating gate by a high voltage applied to the control gate. The other approach is a Fowler-Nordheim tunnelling (hereinafter referred to as a F-N tunnelling) process in which electrons are tunnelled into/from the floating gate by application of a high voltage to the control gate, drain, source or substrate.

Hot electron injection memory cell transistors generate more electrical current than F-N tunnelling memory cell transistors, and they need one bit line contact per cell. Such an increase of the number of contacts inhibits the reduction of chip area and therefore inhibits the reduction in bit cost per cell. On the other hand, although memory cell transistors using the F-N tunnelling process consume less electrical power than those using hot electron injection, they require a voltage higher than that required in hot electron injection. However, the chip area may be readily reduced by one bit line contact for a plurality of series-connected memory cell transistors. The F-N tunnelling approach is therefore widely used in a NAND-type flash memory cell array in which a plurality of series-connected memory cell transistors are connected to a corresponding bit line. The hot electron injection approach is widely used in a NOR-type flash memory cell array in which a plurality of memory cell transistors are connected in parallel between each of a plurality of bit lines and a ground source line.

In NAND-type flash memory, one prior approach to reducing the program voltage is disclosed in an article entitled, "A Novel Booster Plate Technology in High Density NAND Flash Memories for Voltage Scaling-down and Zero Program Disturbance," published in 1996 Symposium on VLSI Technology, pp. 238–239, which corresponds to U.S. application Ser. No. 08/824,483, assigned to the assignee of the present invention. In the device described therein, a plurality of memory strings, each of which includes a plurality of memory cell transistors whose source-drain paths are connected in series on one surface of a semiconductor substrate, are arranged in a matrix configuration of rows and columns. After formation of a conventional NAND-type memory cell array in which control gates of memory cell transistors in each row are connected to a corresponding one of word lines, a program booster plate is formed through a dielectric layer over memory cell transistors of each memory block defined as memory strings in each row. During programming, a boosting voltage applied to the program booster plate may allow a program voltage applied to control gates of a selected word line to be lowered due to a voltage self-boosted to the control gates thereof.

However, since the prior art program booster plate in each memory block is formed on thin plate dielectric layers on the control gates therein, side-wall insulating layers of underlying floating gates and insulating layers on source and drain regions therein, it takes considerable time to charge/discharge the boosting voltage into/from the booster plate, thereby increasing the programming period. Moreover, during its fabrication process, fabrication defects in any one of the insulating layers cause the boosting voltage to be applied to a source, drain, floating gate or control gate of a memory transistor associated therewith. Thus, the memory block associated therewith may malfunction.

SUMMARY OF THE INVENTION

It is therefore an object of the present invention to provide a nonvolatile semiconductor memory which is capable of reducing a program voltage and a program time.

It is another object of the present invention to provide a nonvolatile semiconductor memory which is capable of minimizing the occurrence of fabrication defects.

To achieve the above objects, there is provided in accordance with the invention a nonvolatile semiconductor memory device which includes a plurality of memory cell transistors formed on a semiconductor substrate in a matrix configuration to form an array of rows and columns, each of the memory cell transistors including drain and source regions separately formed on the substrate to define a channel region therebetween. A floating gate is formed over the channel region via a gate oxide layer, and a control gate is formed over the floating gate via a first dielectric layer. A plurality of word line strips are connected with the control gates of the memory cell transistors in each row of the array. A plurality of boosting line strips are formed over the word line strips via a second dielectric layer and are arranged to be substantially self-aligned with corresponding ones of the word line strips.

In one embodiment of the memory device, each of the word line strips is formed from a polycide layer. Each of the boosting line strips can be made from a polycide layer or a metal silicide layer. The second dielectric layer can be formed from a tri-layer of oxide-nitride-oxide.

In another aspect, the invention is directed to a nonvolatile semiconductor memory which includes a plurality of memory cell transistors each having a source, a channel, a drain, a floating gate and a control gate. The semiconductor memory also includes one word line connected to the control gates of the memory cell transistors. The memory includes a boosting line formed over the word line via an interlevel insulating layer. A decoder is connected to the word line and the boosting line to apply a second voltage to the boosting line after charging of a first voltage to the word line during programming. As a result, at least one selected memory cell transistor is programmed by a boosted voltage higher than the first voltage which is capacitively coupled to the boosting line by the application of the second voltage.

In one embodiment of this aspect of the invention, at least one selected memory cell transistor is not programmed by the application of the first voltage to the word line. In one embodiment, the at least one selected memory cell transistor is programmed by Fowler-Nordeim tunneling of electrons between its drain or source and the floating gate. In another embodiment, the at least one selected memory cell transistor is programmed by injection of hot carriers into the floating gate, wherein the hot carriers are produced by a voltage applied between the source and drain of the at least one selected memory cell transistor.

In another aspect, the invention is directed to a method of programming a nonvolatile semiconductor memory, which includes a plurality of memory cell transistors, each having a source, a channel, a drain, a floating gate and a control gate. The memory also includes a word line connected to the control gates of the memory cell transistors and a boosting line substantially self-aligned over the word line via an interlevel insulating layer. The method of the invention includes the step of charging and floating the word line to a first voltage. A second voltage is applied to the boosting line such that the word line is capacitively coupled to a programming voltage higher than the first voltage by the application of the second voltage thereto. As a result, at least one of the memory cell transistors is programmed.

In another aspect, the invention is directed to a method of making a semiconductor device such as a semiconductor memory. Source and drain regions are formed separated from each other via a channel region on a semiconductor substrate. A first conductive layer is formed over a channel region so as to overlap at least an edge portion of the source and drain regions via a gate insulating layer. A first dielectric layer is formed on the first conductive layer, and a second conductive layer is formed on the first dielectric layer. A second dielectric layer is formed on the second conductive layer, and a third conductive layer is formed on the second dielectric layer. The first conductive layer, the first dielectric layer, the second conductive layer, the second dielectric layer and the third conductive layer are etched such that the first, second and third conductive layers are substantially self-aligned.

In one embodiment of this aspect of the invention, the first conductive layer is formed from polycrystalline silicon. The second conductive layer can be formed from one of polycrystalline silicon, polycide and metal silicide. The third conductive layer can also be formed from one of polycrystalline silicon, polycide and metal silicide. The second dielectric layer can be formed from a tri-layer of silicon oxide, silicon nitride and silicon oxide.

In another aspect, the invention is directed to a nonvolatile semiconductor memory which includes a plurality of memory strings arranged in a matrix of rows and columns on a semiconductor substrate, the memory strings in each row defining a memory block. Each of the memory strings includes a plurality of memory cell transistors connected in series between first and second terminals, each of the memory cell transistors having a source, a drain, a floating gate, a control gate and a boosting gate formed over the control gate via a dielectric layer. A plurality of bit lines are connected to the first terminals in each of the columns of the matrix. A plurality of word lines are connected to the control gates of the memory cell transistors in a corresponding one of the rows in each of the memory blocks. A plurality of boosting lines are connected to the boosting gates of the memory cell transistors in the corresponding one of the rows in each memory block. A decoder is connected to the word lines and the boosting lines to program at least one of the memory cell transistors connected to a selected one of the word lines in a selected one of the memory blocks to apply a first voltage and pass voltages to the selected word line and the remaining unselected word lines in the selected memory block, respectively. A voltage is transferred on the bit line connected to the selected to the memory cell transistor to the drain of the selected memory cell transistor. A second voltage is applied to the boosting line associated with the selected word line such that the selected memory cell transistor is programmed by capacitive coupling of the second voltage onto the selected word line.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PRESENT INVENTION

A nonvolatile semiconductor memory according to preferred embodiments of the invention will be described in detail. In the following description, numerous specific details, such as specific dopants, thicknesses of layers, voltage values and the like, are set forth in order to provide a thorough understanding of the present invention. However, it will be obvious to those skilled in the art that the present invention may be practiced without these specific details.

Figure 1A:
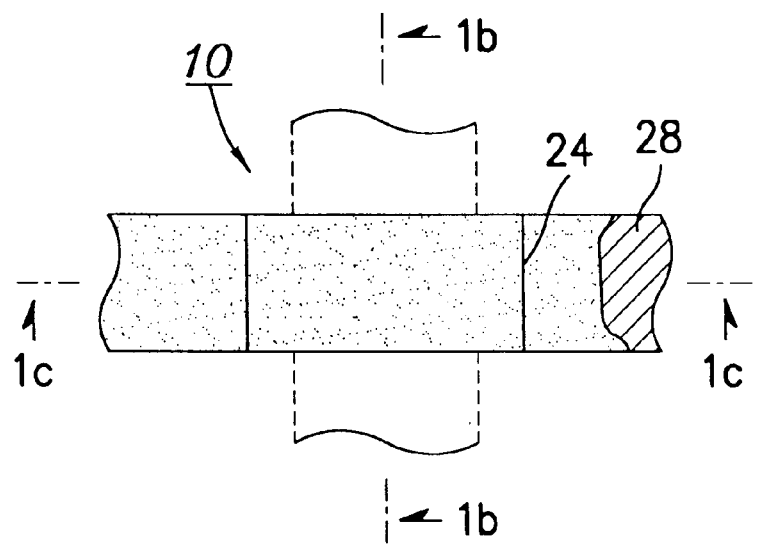
FIG. 1A is an enlarged schematic plan view of a memory cell transistor with a boosting line self-aligned with a word line according to one embodiment of the present invention.
Figure 1B:
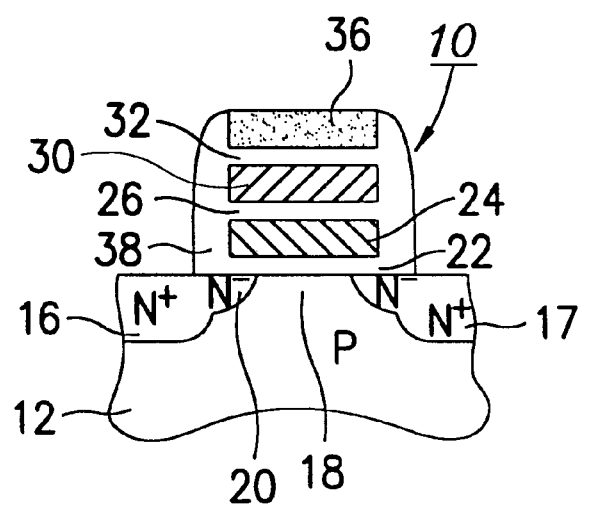
FIG. 1B and FIG. 1C are schematic cross-sectional views of the memory cell transistor of FIG. 1A taken along lines 1b—1b and 1c—1c in FIG. 1A, respectively.
Figure 1C:
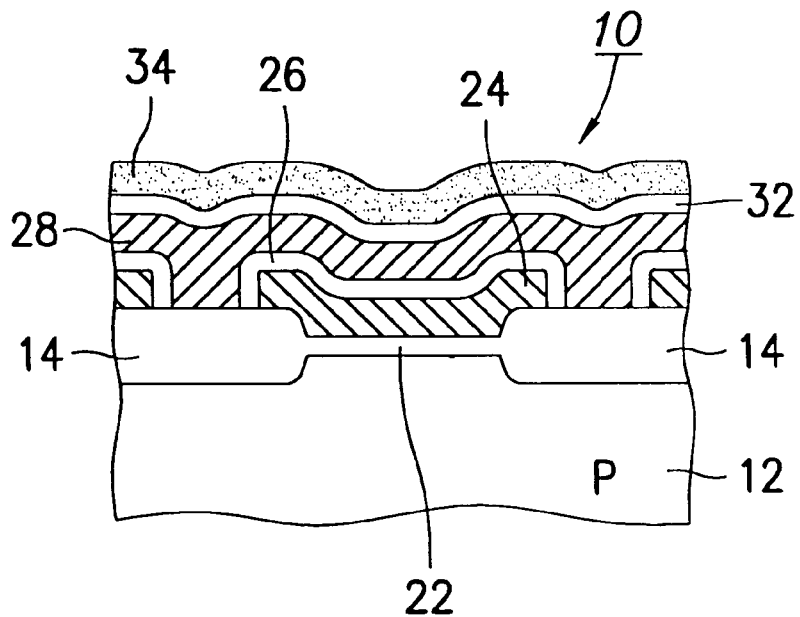

Referring to the drawings, FIG. 1A illustrates an enlarged plan view of one embodiment of a memory cell transistor having a boosting line self-aligned with a word line in accordance with the invention. FIGS. 1B and 1C illustrate cross-sectional views of the memory cell transistor of FIG. 1A taken along lines 1b—1b and 1c—1c, respectively. For the convenience of illustration, although the plan and cross-sectional views of one memory cell transistor associated with a word line of a flash memory cell array are illustrated, it should be noted that a plurality of memory cell transistors are arranged along the word line.

Referring now to FIGS. 1A–1C, field oxide layers 14 laterally isolating the memory cell transistor 10 are formed to define an active region on one surface of a p-type semiconductor substrate. Drain and source regions 16 and 17 are formed on the active region, including lightly doped n-type regions 20 spaced apart by a channel region 18. A floating gate 24 is isolatedly formed over the channel region 18 through a thin gate oxide layer 22. The floating gate 24 extends to opposite end portions of the field oxide layers 14. A control gate 30, which is integrally formed of a conductive word line 28 layer or strip, is formed through a first dielectric layer 26 on the floating gate 24. As shown in FIG. 1C, the first dielectric layer 26 covered by the word line 28 layer extends onto vertically opposite side walls of the isolated floating gate 24. A boosting line or strip 34 is formed over the word line 28 layer interposing a second dielectric layer 32 so as to be self-aligned with the word line 28 layer. As shown in the drawings, the boosting gate 36 is integrally formed with the boosting line 34. Side wall insulating layers 38 are formed on both opposite side walls of the floating gate 24, word line 28 and boosting line 34, all of which are self-aligned.

FIGS. 2A–2H are drawings illustrative of successive fabrication steps of the structure of memory cell transistor shown in FIGS. 1A–1C. FIGS. 2A, 2C, 2E and 2G illustrate the fabrication steps associated with the structure in FIG. 1B and FIGS. 2B, 2D, 2F and 2H represent the fabrication steps associated with the structure in FIG. 1C.

Referring now to FIGS. 2A–2H, the semiconductor substrate 12 may be a p-type well region which is formed in an n-type semiconductor substrate with a concentration of about $5 \times 10^{15}$ atoms/cm$^3$, or in an n-type well region, having a depth of about 10 μm and a concentration of about $5 \times 10^{15}$ atoms/cm$^3$, which is formed on one surface of a p-type semiconductor substrate with a concentration of about $7 \times 10^{14}$ atoms/cm$^3$. The p-type well region may have a depth of about 3 μm and an impurity concentration of about $2 \times 10^{16}$ atoms/cm$^3$.

Figure 2A:
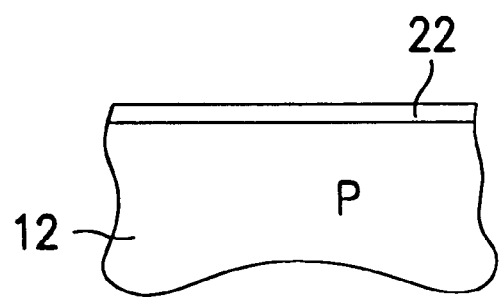
FIGS. 2A–2H schematically illustrate successive steps in the fabrication of the memory cell transistor shown in FIGS. 1A–1C.
Figure 2B:
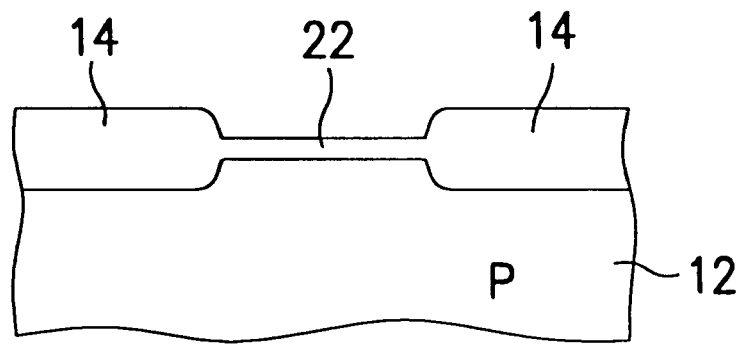
Figure 2C:
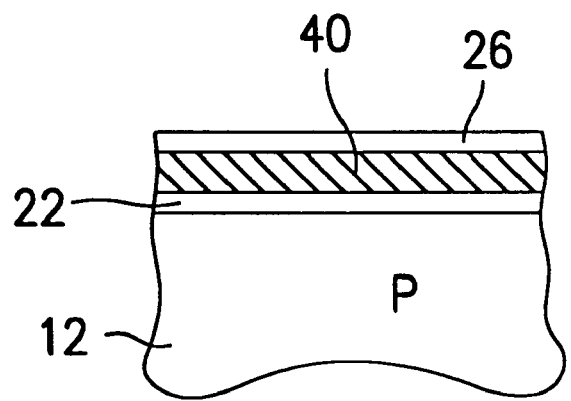

As shown in FIGS. 2A and 2B, field oxide layers 14 and gate oxide layer 22 therebetween are formed on the surface of semiconductor substrate 12 by a conventional isolation technique such as LOCOS. The field oxide layers 14 can have about 2,000 Å in thickness. P-type channel stop regions (not shown) underlying the field oxide layers 14 may be formed by conventional ion implantation. The gate oxide layer 22 can be formed with a thickness in the range of 70~100 Å.

Figure 2D:
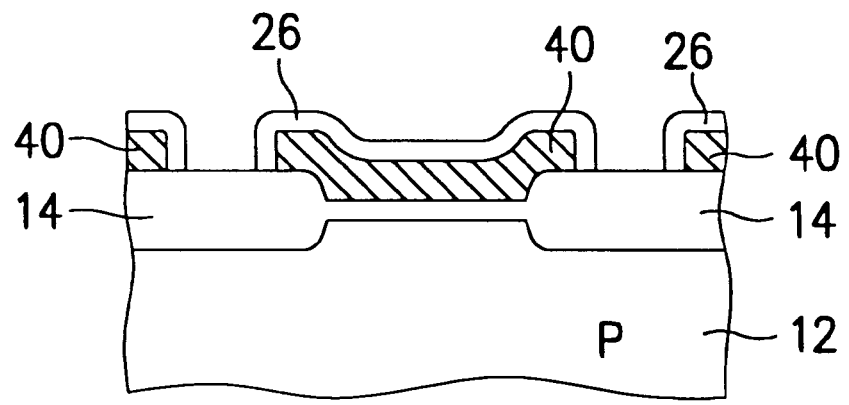

A first poly-crystalline silicon (polysilicon) layer doped with phosphorus is deposited to a thickness of 1,000–2,000 Å on the field oxide layers 14 and gate oxide layer 22 and then etched by a conventional photolithography technique in order to form first conductive layers 40, i.e., floating gate layers, laterally isolated as shown in FIG. 2D. The first conductive layers 40 are formed on the gate oxide layer 22 and on portions of the field oxide layers 14. A first dielectric layer 26 is then deposited on the layers 40 and on the exposed field oxide layers. The first dielectric layer 26 may be a tri-layer of oxide-nitride-oxide (ONO) which is sequentially stacked by a silicon oxide layer of about 70 Å, a silicon nitride layer of about 120 Å and silicon oxide layer of about 40 Å.

Figure 2E:
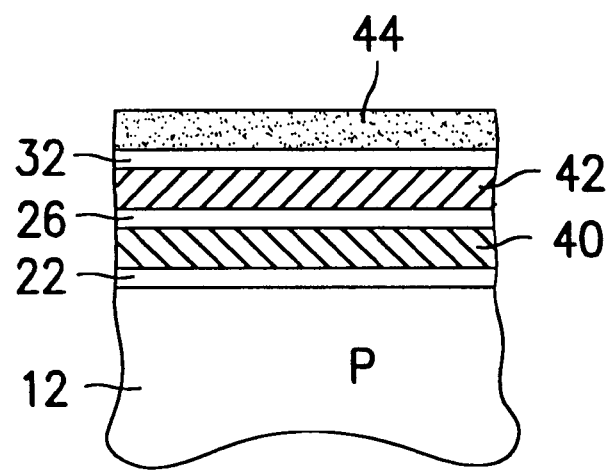
Figure 2F:
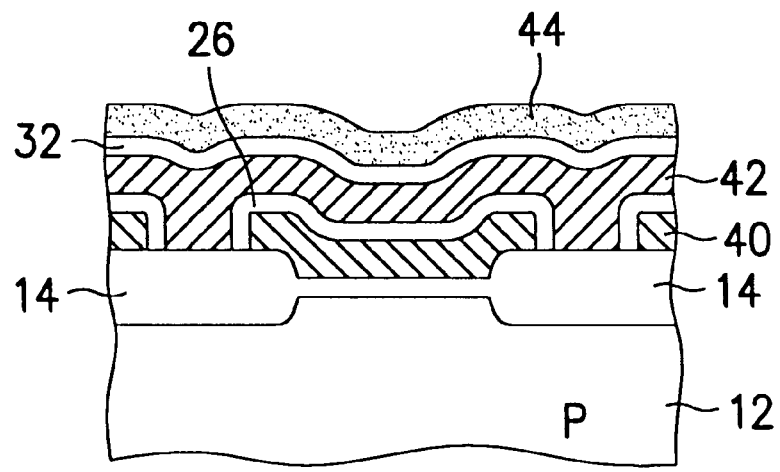

A second conductive layer 42 is deposited on the first dielectric layer 26 as shown in FIGS. 2E and 2F. A second dielectric layer 32 is formed on the second conductive layer 42, and a third conductive layer 44 is then deposited on the second dielectric layer 32. Each of the second and third conductive layers 42 and 44 can be a bilayer of a phosphorus-doped polysilicon layer with a thickness of about 1,000 Å and a tungsten silicide layer deposited on the polysilicon layer by a chemical vapor deposition (CVD) technique with a thickness of about 1,000 Å. However, each of the second and third conductive layers 42 and 44 may be formed of a phosphorus-doped polysilicon, or of a refractory metal silicide such as tungsten silicide or titanium silicide, or of a combination of these. The second dielectric layer 32 may be an ONO layer formed in a manner similar to the first dielectric layer 26, or a high temperature oxide layer deposited at a temperature of about 800° C. with a thickness in the range of about 300–500 Å.

Figure 2G:
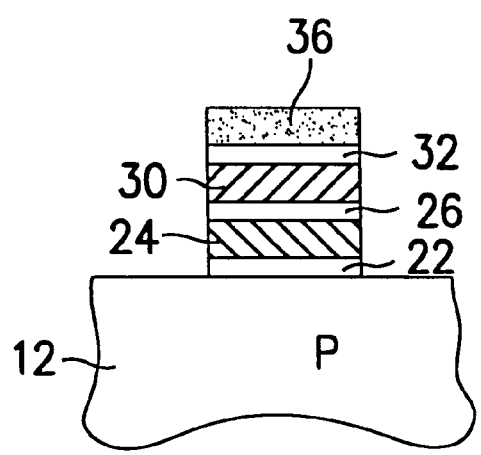
Figure 2H:
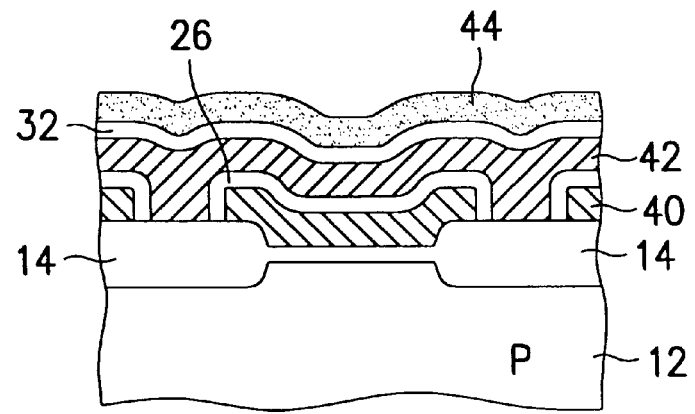

After the formation of the third conductive layer 44, as shown in FIGS. 2G and 2H, the third conductive layer 44, second dielectric layer 32, second conductive layer 42, first dielectric layer 26 and first conductive layer 42 are subjected to sequential, anisotropic etching by using a conventional photomask technique, thereby self-aligning the floating gate 24, first dielectric layer 26, word line 28 strip containing the control gate 30, second dielectric layer 32, and boosting line 34 strip containing the boosting gate 36, all of which are isolated in a vertical direction. Phosphorus ion implantation is then initiated at an energy of about 40 keV with a dose of about $2 \times 10^{13}$ ions/cm$^2$ to form N-type source and drain regions on the exposed semiconductor substrate 12. As shown in FIG. 1B, side wall insulating layers 38 are then formed on opposite side walls of the floating gate 24, word line 28 strip and boosting line 36 strip by conventional side-wall spacer fabrication processes. N+ source and drain regions are then formed at an energy of about 40 keV with a dose of about $5 \times 10^{15}$ ions/cm$^2$ by arsenic ion implantation.

Although the method of manufacturing a memory cell transistor associated with a boosting line strip which is self-aligned with a word line strip has been described, it should be obvious to those skilled in the art that a plurality of memory cell transistors associated with a plurality of boosting line strips, each of which is self-aligned with a corresponding word line strip, may be formed to be arranged in a matrix configuration of rows and columns, in accordance with the invention.

Figure 3:
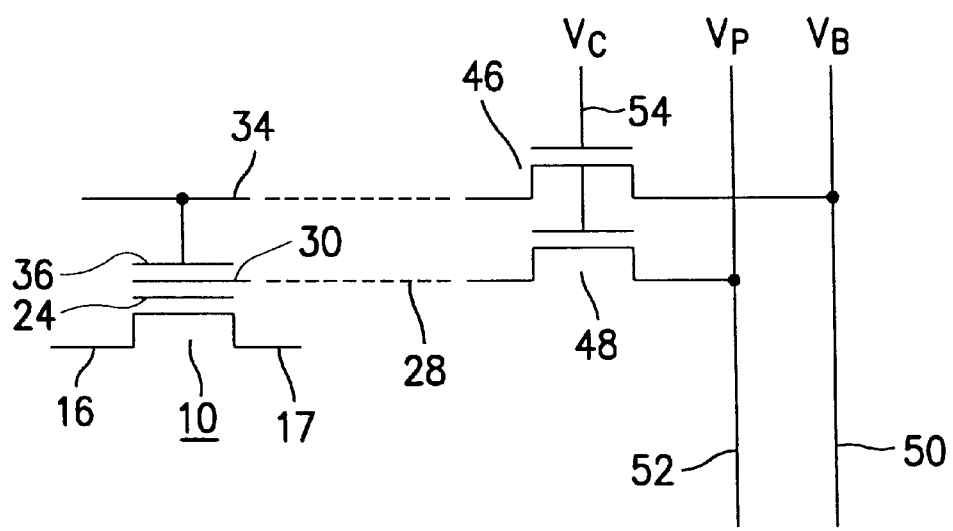
FIG. 3 is a schematic circuit diagram used to illustrate programming of the memory cell transistor shown in FIG. 1 according to one embodiment of the present invention.
Figure 4:
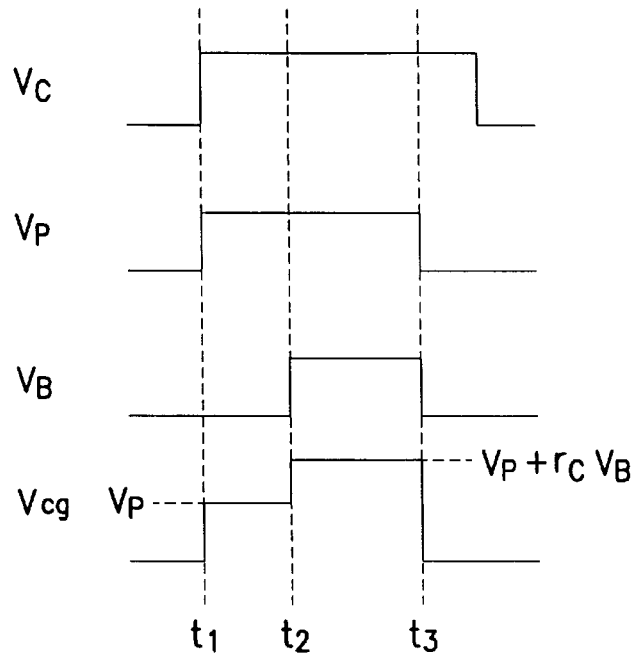
FIG. 4 is a schematic timing chart of signals generated at portions of the circuit of FIG. 3 for programming the memory cell transistor of FIG. 1.

FIG. 3 represents a schematic equivalent circuit diagram used to illustrate programming of the memory cell transistor 10 shown in FIGS. 1A–1C. FIG. 4 is a timing diagram of signals at various portions of FIG. 3 used to program the memory cell transistor 10. Referring to FIG. 3, boosting line 34 connected to the boosting gate 36 of the memory cell transistor 10 is connected to a second voltage supplying line 50 through the source-drain path of a first switching transistor 46. During programming, a second voltage $V_B$ of about 6–11 volts is applied to the second voltage supplying line 50. Word line 28 connected to the control gate 30 is connected to a first voltage supplying line 52 through the source-drain path of a second switching transistor 48. During the programming, a first voltage $V_P$ of 6–11 volts is applied to the first voltage supplying line 52. Gate electrodes of the first and second switching transistors 46 and 48 are connected to a control line 54. During programming, a control voltage Vc is applied to the control line 54 to transfer the first and second voltages $V_P$ and $V_B$ to the word line 28 and the boosting line 34, respectively.

Figure 5:
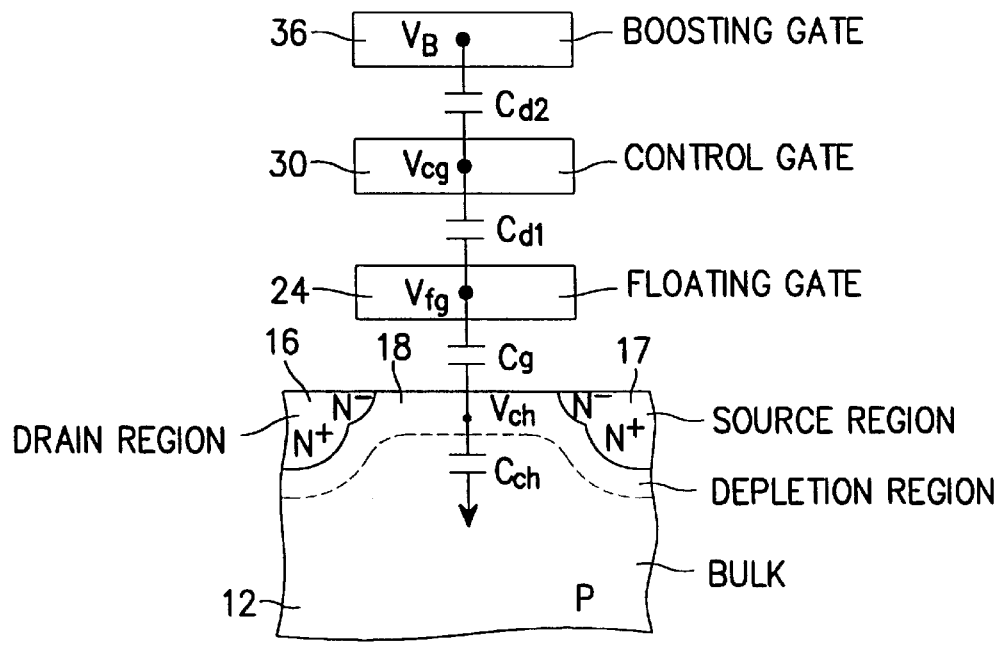
FIG. 5 is a schematic view illustrating capacitances of various portions of the memory cell transistor of FIG. 1.

Referring now to the timing diagram of FIG. 4, a method of programming the memory cell transistor 10 will be described. At time t1, control voltage Vc, with a voltage value of the first voltage $V_P$ added to $V_{th}$ (threshold voltages of switching transistors 46 and 48), is applied to the control line 54 to begin programming. At the same time, the first voltage $V_P$ is applied to the first voltage supplying line 52. Then, the switching transistor 48 is rendered conductive and thereby the word line 28 is charged to the first voltage $V_P$. As a result, the control gate 30 maintains the first voltage $V_P$. After the charging of word line 28, i.e., control gate 30, the second voltage $V_B$ is applied onto the line 50 at time t2. Then, the boosting line 34 is charged to the second voltage $V_B$ via the conductive switching transistor 46. Therefore, the control gate 36 is charged to the boosting voltage $V_B$. As shown in FIG. 5, the capacitance between drain and source regions 16 and 17 and between channel region 18 and the bulk of the substrate 12 (ground voltage is applied to the bulk during the programming) is $C_{ch}$; the capacitance between the floating gate 24 and the channel region 18 is $C_g$; the capacitance between the control gate 30 and the floating gate 24 is $C_{d1}$; and the capacitance between the boosting gate 36 and the control gate 30 is $C_{d2}$. Therefore, the second voltage $V_B$ applied to the boosting gate 36 allows the control gate 30 and word line 28 to be boosted. As a result, a control gate voltage $V_{cg}$ is given by the following equation (1).

$$V_{cg} = V_P + \gamma_C V_B \quad (1)$$

where the coupling coefficient $\gamma_C = \dfrac{C_{d2}}{C_{d2} + C_{eg}}$ and $$C_{eg} = \dfrac{C_{d1} C_g C_{ch}}{C_{d1} C_g + C_g C_{ch} + C_{ch} C_{d1}}$$

Therefore, if the word line 28 is boosted to a voltage higher than the first voltage $V_P$, the second switching transistor 48 is turned off. The memory cell transistor 10 is then programmed by the voltage $V_P + \gamma_C V_B$ which is boosted onto the word line 28.

Assuming that $V_P = V_B$, $\gamma_C = 0.8$, and control gate voltage $V_{cg}$ is 17 volts to program with the F-N tunnelling method, the first voltage $V_P$ is given as about 9.4 volts by equation (1). As a result, the first voltage $V_P$ applied to the control gate may be reduced to $$\dfrac{V_{cg}}{1 + \gamma_C}$$

to program. Thus, the area of high voltage generating circuit may be decreased, thereby reducing the chip area. A voltage value of $V_P + V_{th}$ may be applied to lines 52 and 54 in order to charge the word line 28 to the first voltage $V_P$ between times t1 and t2.

At time t3, the first and second voltages $V_P$ and $V_B$ go to a ground voltage of 0 volts, and then the control voltage Vc also goes to the ground voltage.

On the other hand, if the memory cell transistor 10 is programmed by hot carrier injection in the prior art in which the boosting gate 26 is not used, a drain voltage applied to the drain region 16 connected to the bit line (not shown) is about 6.5 volts, a source voltage applied to the source region 17 connected to the source line (not shown) is ground voltage, and the program voltage applied to the control gate 30 is about 12 volts. However, according to the present invention, the first voltage applied to the control gate 30 may be reduced to about 6.5 volts by using the boosting gate 36 self-aligned with the control gate 30 to program the memory cell transistor 10.

Figure 6:
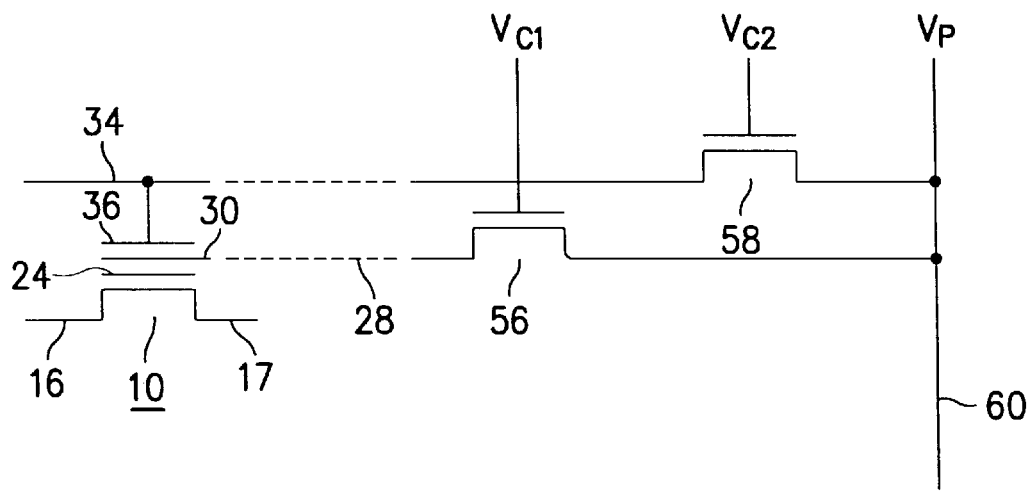
FIG. 6 is a schematic circuit diagram used to illustrate programming of the memory cell transistor of FIG. 1 according to another embodiment of the present invention.
Figure 7:
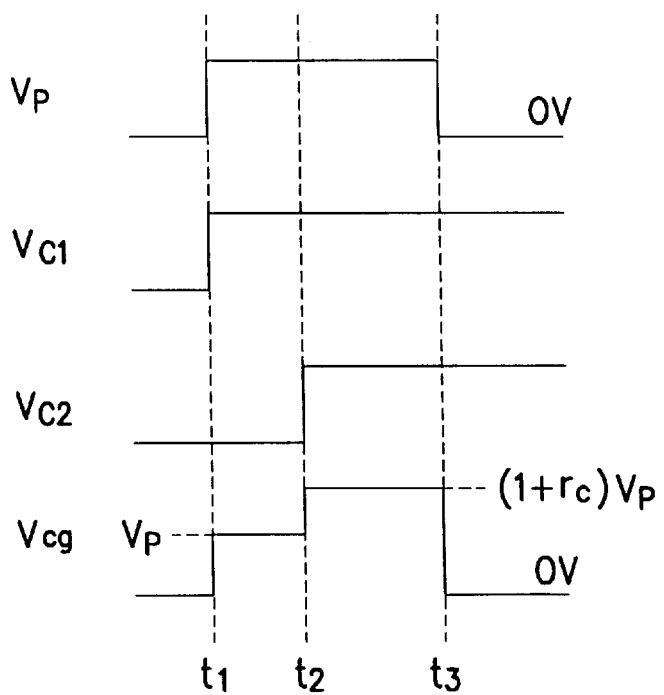
FIG. 7 is a schematic timing chart of signals generated at portions of the circuit of FIG. 6 during programming.

FIG. 6 shows a schematic equivalent circuit of second embodiment for programming a memory cell transistor, and FIG. 7 shows a timing chart of signals at various portions of FIG. 6 during programming. Referring to FIG. 6, the word line 28 and boosting line 34 are connected to the first voltage supplying line 60 via source-drain paths of first and second switching transistors 56 and 58, respectively. Gate electrodes of the first and second switching transistors 56 and 58 are respectively coupled to first and second control voltages Vc1 and Vc2.

Referring to FIG. 7, at time t1, the first voltage $V_P$ is applied to the program voltage supplying line 60. At the same time, the first voltage $V_P$ is charged to the word line 28 by the application of first control voltage Vc1 to the gate of transistor 56. Thereafter, at time t2, the first voltage $V_P$ is charged to the boosting line 34 by the application of second control voltage Vc2 to the gate of transistor 58. As a result, the control gate voltage $V_{cg}$ of memory cell transistor 10 is determined according to the following equation (2) by the application of the first voltage $V_P$ to the boosting gate 36.

$$V_{cg} = V_P + \gamma_C V_P = (1 + \gamma_C) V_P \quad (2)$$

As described above, in the case where the program voltage applied to the control gate is $V_{pgm}$ in the prior art, the first voltage $V_P$ applied to the control gate 30 is reduced to $V_{pgm}/(1+\gamma_C)$ in the present invention.

At time t3, the first voltage $V_P$ goes to the ground voltage. Thus, the voltages on the word line 28 and boosting line 34 are discharged to the ground voltage via source to drain paths of the first and second switching transistors 56 and 58.

A NAND type memory cell array is comprised of a plurality of memory strings arranged in a matrix of rows and columns. A memory block defines memory strings in each row.

Figure 8A:
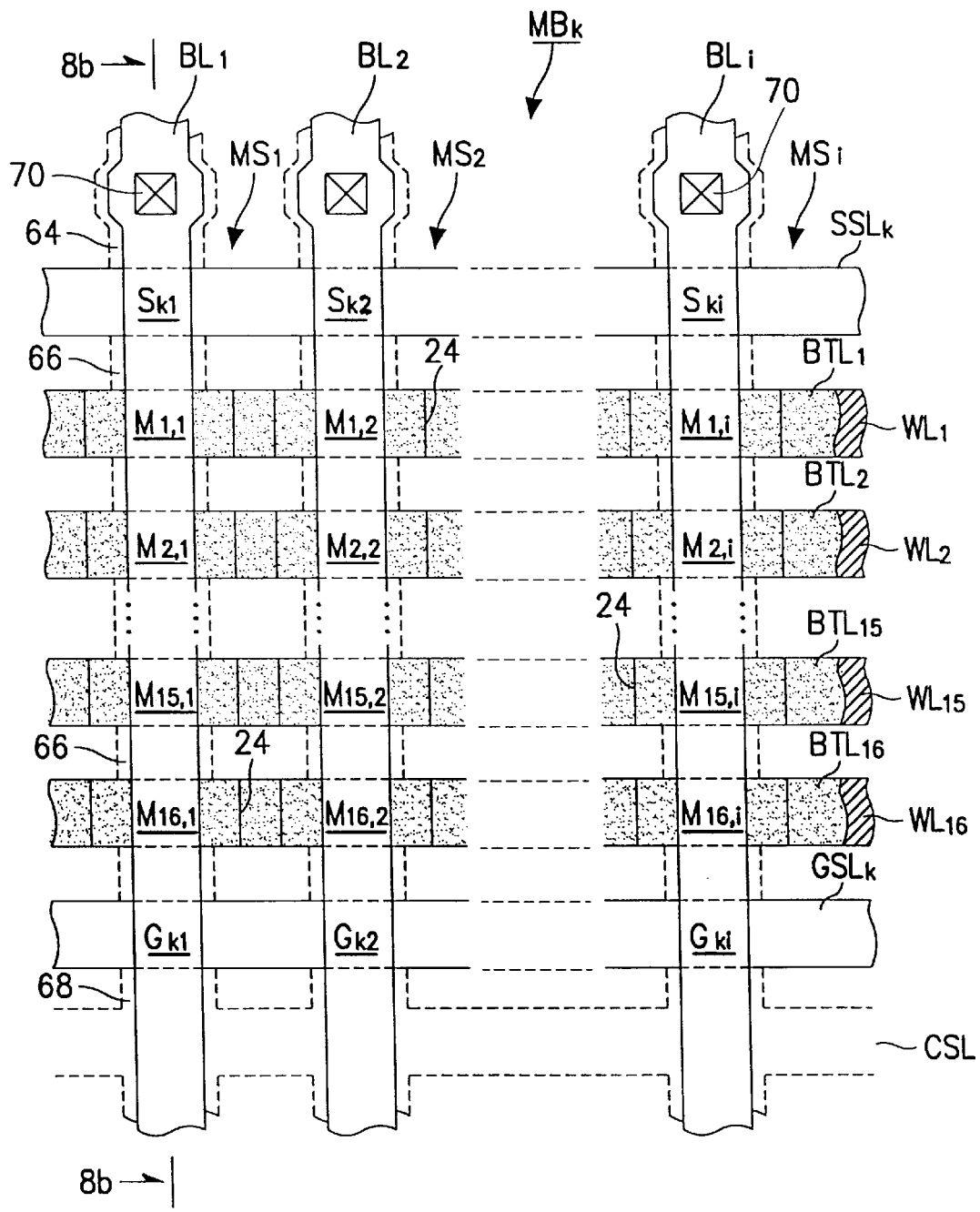
FIG. 8A is an enlarged schematic plan view of a portion of NAND-type memory cell array according to an embodiment of the present invention.
Figure 8B:
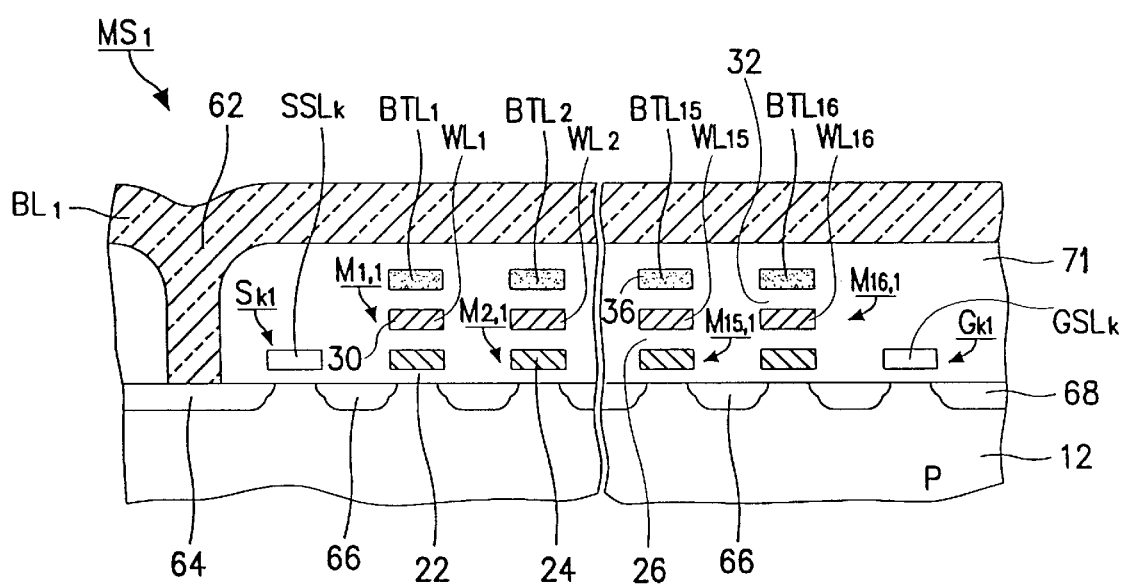
FIG. 8B is a schematic cross-sectional view taken along lines 8b—8b of FIG. 8A.

For the convenience of illustration, FIG. 8A shows a memory block of a NAND type memory cell array. It should be noted that other memory blocks are symmetrically arranged with respect to a line connecting contact openings 70 and to a common source line CSL. FIG. 8B shows a cross-sectional view taken along a line 8b—8b of FIG. 8A.

Referring to FIGS. 8A and 8B, a memory block $MB_k$ includes a plurality of memory strings $MS_1$–$MS_i$. Each memory string MSj (j=1, 2, . . . i) is comprised of sixteen memory cell transistors $M_{1,j}$–$M_{16,j}$ whose drain-source paths are connected in series between a source region 66 of first selection transistor $S_{kj}$ and a drain region 68 of second selection transistor $G_{kj}$. Adjacent transistors are connected by common source-drain regions 66 as shown in FIG. 8B.

As described in connection with FIGS. 1A–1C, each of floating gates 24 is formed over the channel region of a corresponding memory cell transistor via gate oxide layer 22. Each of control gates 30 is formed over each floating gate 24 via first dielectric layer 26. Each boosting gate 36 is formed over each control gate 30 via second dielectric layer 32.

Gates made of polysilicon, polycide or metal silicide are formed over channel regions of first and second selection transistors $S_{kj}$ and $G_{kj}$ via gate oxide layers. Gates of first selection transistors $S_{k1}$–$S_{ki}$ are connected to a first selection line $SSL_k$ layer made of polysilicon, polycide or metal silicide. Gates of second selection transistors $G_{k1}$–$G_{ki}$ are connected to a second selection line $GSL_k$ layer made of polysilicon, polycide or metal silicide. Control gates 30 of memory cell transistors $M_{1,1}$–$M_{1,i}$, $M_{2,1}$–$M_{2,i}$, . . . , and $M_{16,1}$–$M_{16,i}$ in each row are connected to a corresponding layer of word lines WL1–WL16. Boosting gates 36 of memory cell transistors in each row are connected to a corresponding layer of boosting lines BTL1–BTL16. An interlevel dielectric layer 71, such as a chemical vapor deposition (CVD) SiO2 layer, borophosphosilicate glass (BPSG) layer or phosphosilicate glass (PSG) layer, is formed to cover gates of first and second selection transistors $S_{k1}$–$S_{ki}$ and $G_{k1}$–$G_{ki}$ and boosting gates 36 of memory cell transistors $M_{1,1}$–$M_{16,i}$, as shown in FIG. 8B.

Drain regions 64 of the first selection transistors $S_{k1}$–$S_{ki}$ are respectively connected to layers of bit lines BL1–BLi, which are made of metal, polysilicon, polycide, or metal silicide, via contact holes 62 in the dielectric layer 71. Source regions of the second selection transistors $G_{k1}$–$G_{ki}$ are connected to the common source line CSL which is heavily doped with an n-type dopant. As described above, although each memory string is comprised of sixteen series-connected memory cell transistors, it should be noted that the present invention is not limited to those. For example, the number of memory cell transistors in each memory string may be $2^n$ where n is a positive integer.

Figure 9A:
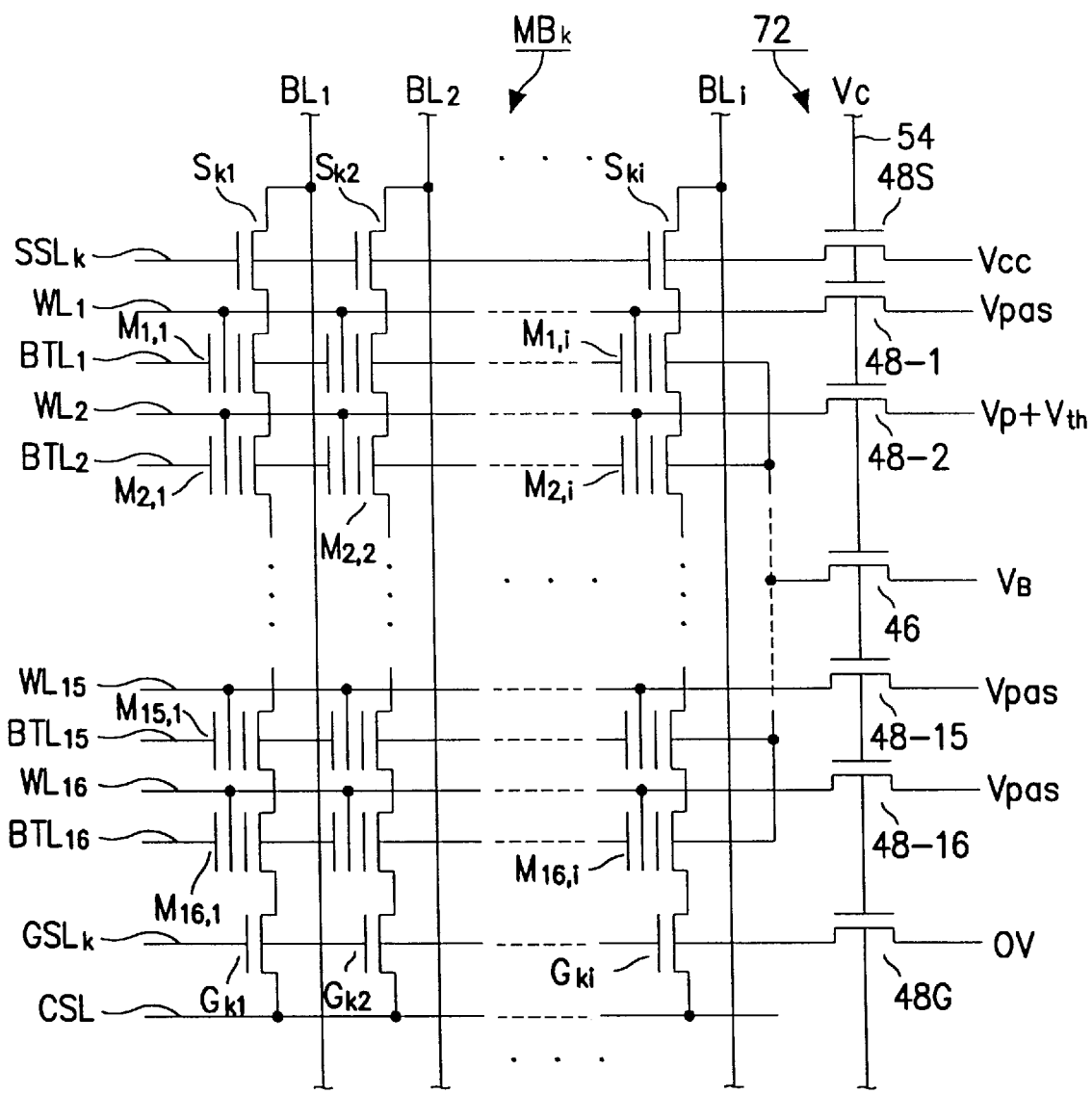
FIG. 9A is a schematic circuit diagram used to illustrate programming of the memory cell transistors shown in FIG. 8A according to one embodiment of the present invention.

FIG. 9A shows a schematic equivalent circuit diagram illustrating programming of the NAND type memory cell array shown in FIG. 8A. In the drawing of FIG. 9A, first and second selection lines $SSL_k$ and $GSL_k$ and word lines WL1–WL16 are connected to source-drain paths of switching transistors 48S, 48G and 48-1 through 48-16, respectively. Boosting lines BTL1–BTL16 are connected in common to the source-drain path of switching transistor 46. The switching transistors 48S, 48G, 48-1 through 48-16 and 46 constitute a decoder 72.

During programming, control voltage $V_C$ is applied to gates of switching transistors 48S, 48G, 48-1 through 48-16 and 46 to transfer the first voltage, i.e., program voltage $V_P$, to a selected word line. The power supply voltage Vcc, for example 3.3 volts, is also applied to drains of switching transistors 48S and 48G. The voltage value of $V_P+V_{th}$ ($V_{th}$ is a threshold voltage of each switching transistor) is applied to the drain of switching transistor associated with the selected word line, and pass voltage $V_{pas}$ (less than the first voltage $V_P$) is applied to drains of switching transistors associated with nonselected word lines. The second voltage $V_P$ is applied to the drain of switching transistor 46 to transfer to boosting lines BTL1–BTL16.

It is now assumed, for example, that memory cell transistor $M_{2,1}$ of memory cell transistors $M_{2,1}$–$M_{2,i}$, which is connected to word line WL2, is to be programmed, and the remaining memory cell transistors $M_{2,2}$–$M_{2,i}$ are in erased states, i.e., unprogrammed states. A data latch (not shown) connected to the bit line BL1 stores data "0", i.e., ground voltage, and data latches (not shown) connected to the remaining bit lines BL2–BLi store data "1", i.e., power supply voltage Vcc. The common source line CSL and the semiconductor substrate 12 are in ground states. It is also assumed that a threshold voltage of each of switching transistors 48S, 48G, 48-1 through 48-16 and 46 and first selection transistors is $V_{th}$.

Figure 9B:
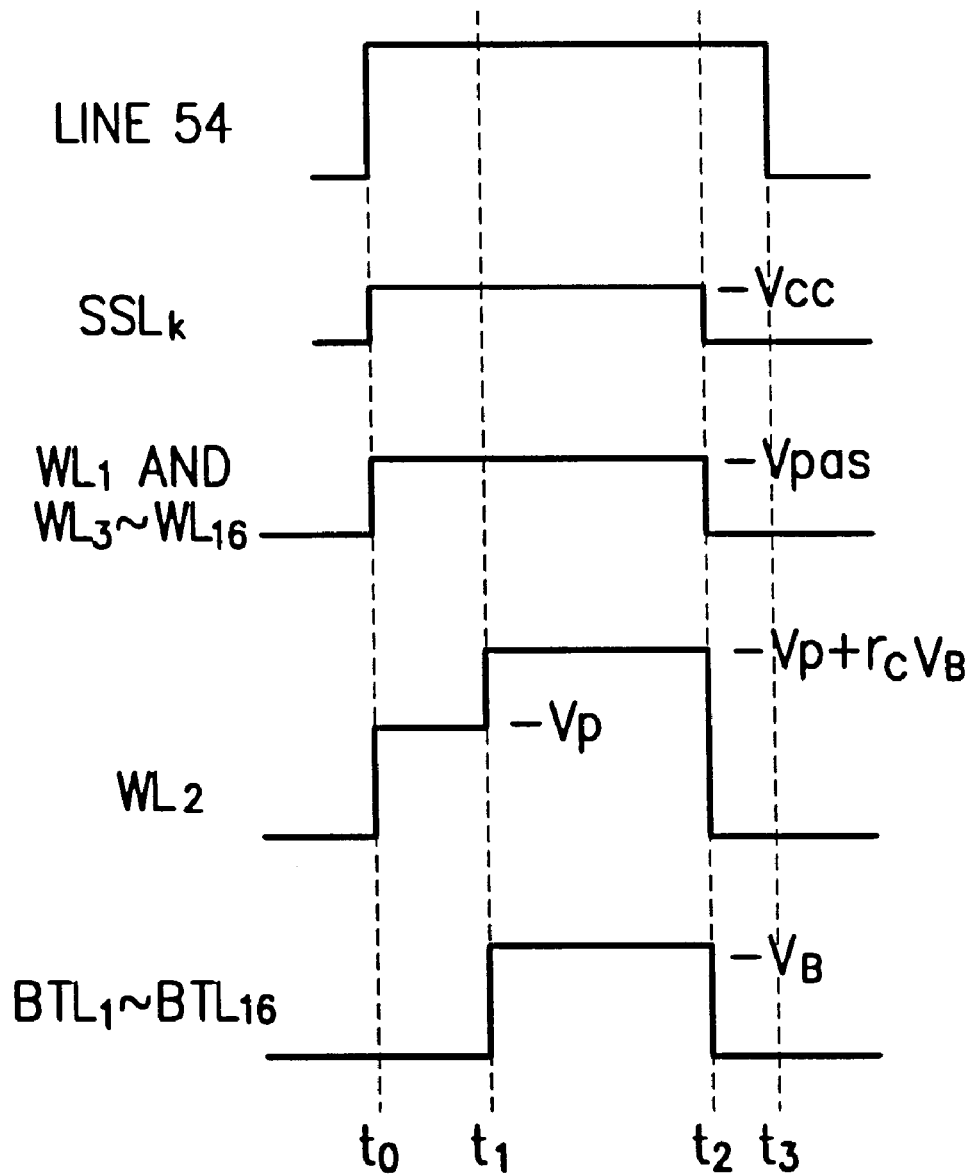
FIG. 9B is a schematic timing chart of signals generated at portions of the circuit of FIG. 9A for programming memory cell transistors associated with a selected word line.

As shown in FIG. 9B, at time t0, a voltage on line 54 transits from 0 volts to program control voltage Vc. The program control voltage Vc has a voltage value of $V_P+V_{th}$. Switching transistors 48S, 48G, 48-1 through 48-16 and 46 are turned on by the voltage Vc on the line 54, thereby charging first and second selection lines to Vcc and 0 volts, respectively. At the same time, unselected word lines WL1 and WL3 through WL16 are charged to pass voltage $V_{pas}$, and the selected word line WL2 is charged to first voltage $V_P$. Thus, first selection transistors $S_{k1}$–$S_{ki}$ are turned on, thereby allowing the source of the first selection transistor $S_{ki}$ to be maintained at 0 volts and sources of the remaining first selection transistors $S_{k2}$–$S_{ki}$ to be charged to Vcc–$V_{th}$. The pass voltage $V_{pas}$ is less than the first voltage $V_P$. The pass voltage $V_{pas}$ also has a voltage value high enough to transfer the voltage Vcc–$V_{th}$ to the sources via channels of memory cell transistors when applied to the control gates thereof. Thus, the drain, channel and source of the memory cell transistor $M_{2,1}$ to be programmed maintain 0 volts. However, drains, channels and sources of unprogrammed memory cell transistors $M_{2,2}$–$M_{2,i}$ are charged to voltage $V_{ch1}$ given by the following equation (3).

$$C_{ch1} = \frac{15\gamma V_{pas} + \gamma V_P}{16} + V_{CC} - V_{th} \quad (3)$$

$$\text{where } \gamma = \frac{C_{-1}}{C_1 + C_{ch}} \text{ and } C_1 = \frac{C_{dl}C_g}{C_{dl} + C_g}$$

Since the first voltage $V_P$ is less than the effective program voltage producing F-N tunnelling of electrons to the floating gate, the memory cell transistor $M_2$, is not programmed between t0 and t1. The memory cell transistors $M_{2,2}$–$M_{2,i}$ cannot be programmed by the voltage $V_{ch1}$ charged to their drains, channels and sources.

At time t1, second voltage $V_B$ is applied to boosting lines BTL1–BTL16. Then, a voltage on the selected word line WL2 is boosted or increased to $V_P+\gamma_C V_B$, as given by equation (1), thereby turning off the switching transistor 48-2. However, since Vc–$V_{pas}$>$V_{th}$, switching transistors 48-1 and 48-3 through 48-16 are in conductive states. Thus, between t1 and t2, unselected word lines WL1 and WL3–WL16 maintain the pass voltages $V_{pas}$. The memory cell transistor $M_{2,1}$ is programmed by the boost voltage $V_P+\gamma_C V_B$ applied between the control gate and drain, channel and source thereof. However, drains, channels and sources of the memory cell transistors $M_{2,2}$–$M_{2,i}$ are charged to voltages $V_{ch2}$ given by the following equation (4), and thereby the memory cell transistors $M_{2,2}$–$M_{2,i}$ are not programmed.

$$V_{ch2} = \frac{15\gamma(V_{pas} + \gamma_C V_B) + \gamma(V_P + \gamma_C V_B)}{16} + V_{CC} - V_{th} \quad (4)$$

At time t2, voltages on lines $SSL_k$, WL1–WL16 and BTL1–BTL16 go to 0 volts. Thereafter, at time t3, a voltage on the line 54 transits to 0 volt, thereby completing one cycle of programming.

Although the transitions of voltages on word lines WL1–WL16 occur at the same time when first and second selection lines $SSL_k$ and $GSL_k$ go to Vcc as shown in FIG. 9B, their transitions may be generated between t0 and t1 after the voltage transitions of first and second selection lines $SSL_k$ and $GSL_k$. That is, the voltage $V_P+V_{th}$ applied to the drain of switching transistor 48-2 and voltages $V_{pas}$ applied to drains of switching transistors 48-1 and 48-3 through 48-16 may be applied between t0 and t1.

Figure 10A:
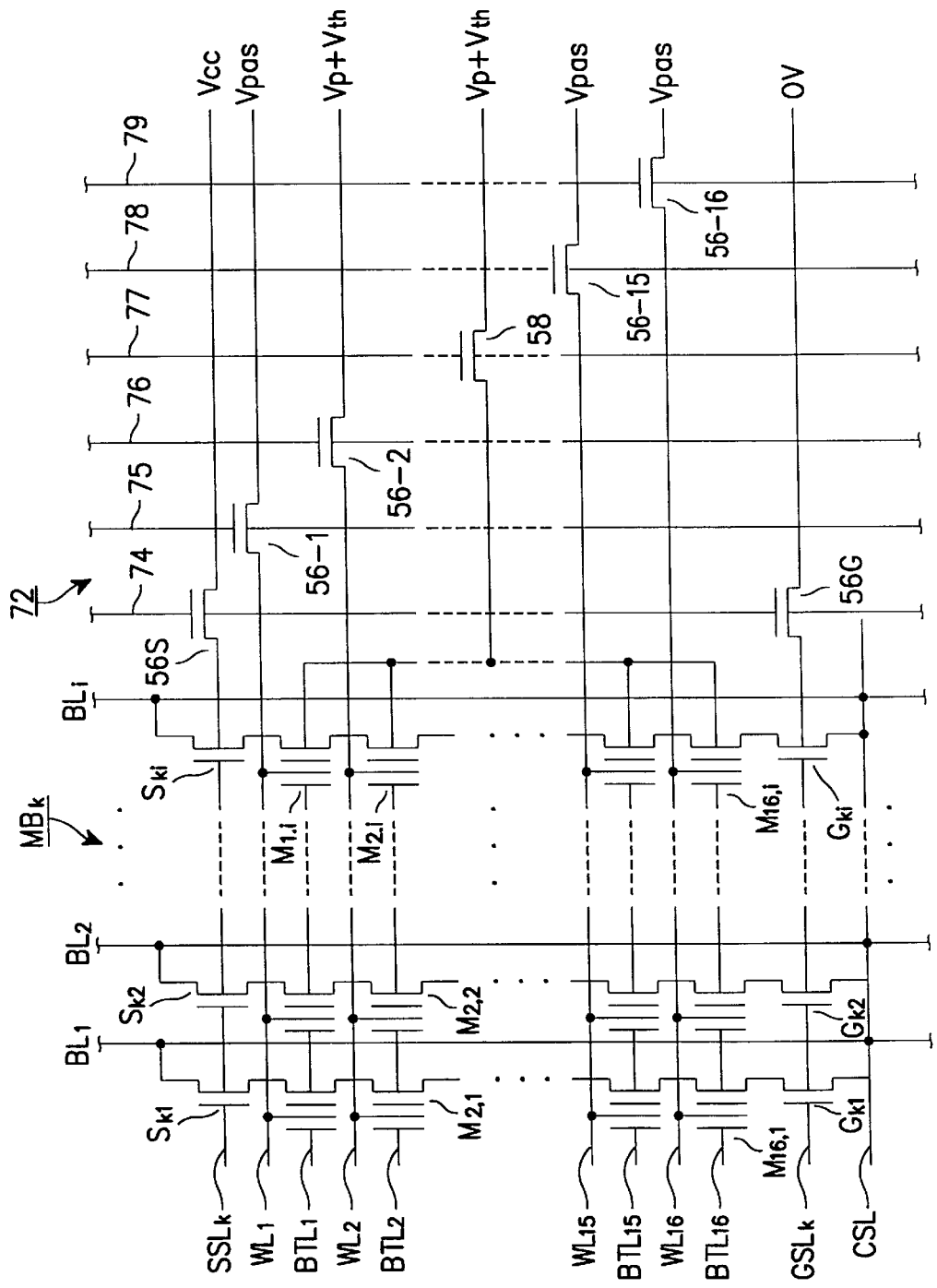
FIG. 10A is a schematic circuit diagram used to illustrate programming of the memory cell transistors in FIG. 8A according to another embodiment of the present invention.
Figure 10B:
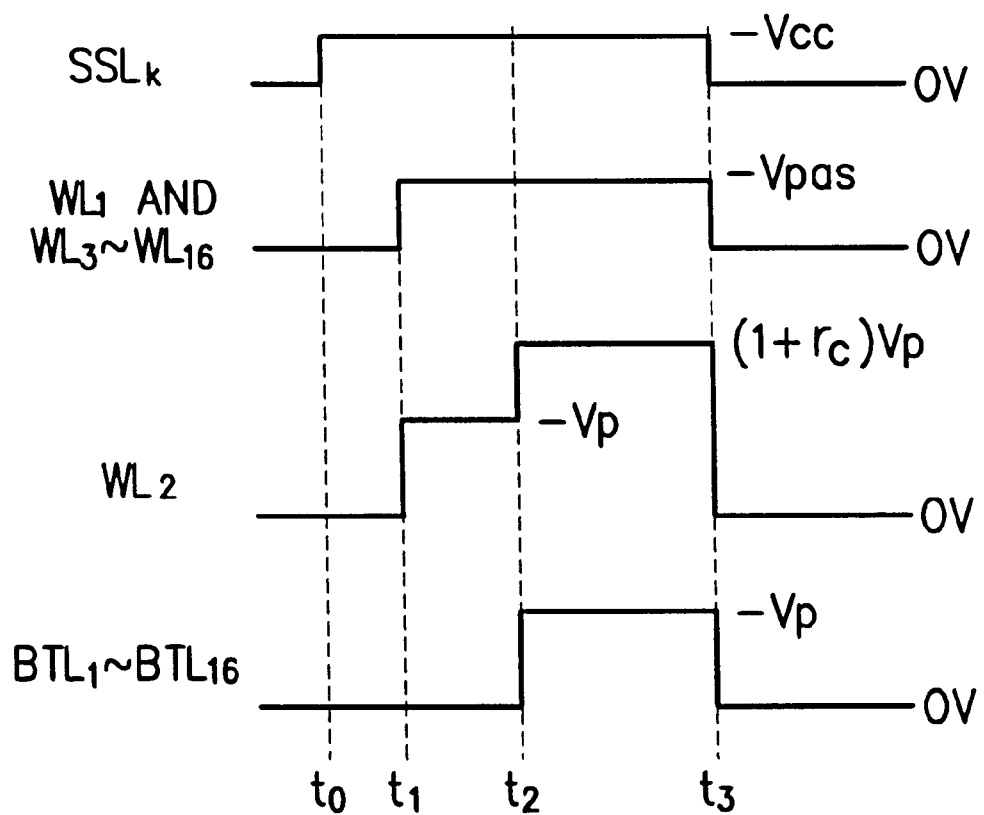
FIG. 10B is a schematic timing chart of signals generated at portions of the circuit of FIG. 10A for programming memory cell transistors associated with a selected word line.

FIG. 10A shows a schematic equivalent circuit diagram of another embodiment for programming the NAND type memory cell array as shown in FIG. 8, and FIG. 10B a timing diagram of signals at various portions of FIG. 10A.

Gate electrodes of switching transistors 56S, 56G, 56-1, ..., 58, ... 56-15 and 56-16 constituting decoder 72 of FIG. 10A are respectively connected to control lines 74-79, while gate electrodes of switching transistors 48S, 48-1 through 48-16, 46 and 48G of FIG. 9A are connected to a control line 54.

It is assumed, for example, that during the programming, word line WL2 is to be selected, memory cell transistor $M_{2,1}$ is to be programmed, and the remaining transistors $M_{2,2}-M_{2,i}$ are not to be programmed. Then, as described above, ground voltage and power supply voltages Vcc are applied to bit lines BL1 and BL2–BLi from data latches (not shown). It is also assumed that threshold voltages of switching transistors 56S and 56G, 56-1 through 56-16 and 58 and first selection transistors $S_{k1}-S_{ki}$ are $V_{th}$.

At time t0, the first selection line $SSL_k$ is charged to Vcc by the application of $Vcc+V_{th}$ to the control line 74, thereby turning on first selection transistors $S_{k1}-S_{ki}$. Thus, sources of first selection transistors $S_{k1}$ and $S_{k2}-S_{ki}$ are charged to ground voltage and $Vcc-V_{th}$, respectively.

At time t1, control lines 75, 76, 78 and 79 go to $V_P+V_{th}$, thereby allowing unselected word lines WL1 and WL3–WL16 to go to the pass voltage $V_{pas}$. At the same time, the selected word line WL2 is charged to the first voltage $V_P$. Thus, the drain, channel and source of memory cell transistor $M_{2,1}$ maintain ground voltage, i.e., 0 volt, while drains, channels and sources of memory cell transistors $M_{2,2}-M_{2,i}$ are charged to $V_{ch1}$ given by the equation (3).

At time t2, the control line 77 goes to $V_P+V_{th}$, thereby allowing boosting lines BTL1–BTL16 to go to $V_P$. Thus, as described above, the selected word line WL2 is boosted to $(1+\gamma_C) V_P$ and unselected word lines WL1 and WL3–WL16 maintain pass voltages $V_{pas}$. As a result, the memory cell transistor $M_{2,1}$ is programmed by the boosted voltage $(1+\gamma_C) V_P$, while drains, channels and sources of memory cell transistors $M_{2,2}-M_{2,i}$ are charged to voltage $V_{ch2}$ given by the following equation (5), thereby preventing them from being programmed.

$$V_{ch2} = \frac{15\gamma(V_{pas} + \gamma_C V_P) + \gamma V_P(1 + \gamma_C)}{16} + V_{CC} - V_{th} \quad (5)$$

As described above, since the memory cell array of the present invention includes boosting lines self-aligned with word lines, the first voltage on the selected word line may be self-boosted to the program voltage by applying the second voltage to the boosting line thereover after the application of the first voltage. Thus, selected memory cells maybe programmed by the self-boosted word line voltage, thereby lowering the program voltage. Since the area to which the second voltage is applied may be reduced as compared with the prior art, it is possible to program memory cell transistors at high speed.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A nonvolatile semiconductor memory device, comprising:

a plurality of memory cell transistors formed on a semiconductor substrate in a matrix configuration to form an array of rows and columns, each of said memory cell transistors including drain and source regions separately formed on said substrate to define a channel region therebetween, a floating gate formed over said channel region via a gate oxide layer, and a control gate formed over said floating gate via a first dielectric layer;

a plurality of word line strips each connected with the control gates of said memory cell transistors in each row; and a plurality of boosting line strips formed over said word line strips via a second dielectric layer, and arranged to be substantially self-aligned with corresponding ones of said word line strips.

2. A nonvolatile semiconductor memory device as recited in claim 1, wherein each of said word line strips is formed from a polycide layer.

3. A nonvolatile semiconductor memory device as recited in claim 2, wherein each of said boosting line strips is formed from one of a polycide layer and a metal silicide layer.

4. A nonvolatile semiconductor memory device as recited in claim 1, wherein said second dielectric layer is formed from a tri-layer formed of oxide-nitride-oxide.

5. A nonvolatile semiconductor memory including a plurality of memory cell transistors each having a source, a channel, a drain, a floating gate and a control gate, and at least one word line connected to the control gates of said memory cell transistors, said memory comprising:

a boosting line formed over said word line via a interlevel insulating layer; and a decoder connected to said word line and said boosting line to apply a second voltage to said boosting line after charging of a first voltage to said word line during programming, whereby at least one selected one of said memory cell transistors is programmed by a boosted voltage higher than the first voltage which is capacitively coupled to said boosting line by the application of said second voltage.

6. A nonvolatile semiconductor memory as recited in claim 5, wherein said at least one selected one of said memory cell transistors is not programmed by the application of the first voltage to said word line.

7. A nonvolatile semiconductor memory as recited in claim 5, wherein said at least one selected one of said memory cell transistors is programmed by Fowler-Nordeim tunneling of electrons between its drain or source and floating gate.

8. A nonvolatile semiconductor memory as recited in claim 5, wherein said at least one selected one of said memory cell transistors is programmed by injection of hot carriers into said floating gate, said hot carriers produced by a voltage applied between its source and drain.

9. A nonvolatile semiconductor memory comprising:

a plurality of memory strings arranged in a matrix of rows and columns on a semiconductor substrate, the memory strings in each row defining a memory block;

each of said memory strings including a plurality of memory cell transistors connected in series between first and second terminals, each of said memory cell transistors having a source, a drain, a floating gate, a control gate and a boosting gate formed over said control gate via a dielectric layer;

a plurality of bit lines each connected to the first terminals in each of said columns;

a plurality of word lines each connected to the control gates of the memory cell transistors in a corresponding one of rows in each of said memory blocks;

a plurality of boosting lines each connected to the boosting gates of said memory cell transistors in said corresponding one of said rows in said each memory blocks; and a decoder connected to said word lines and said boosting lines to program at least one of said memory cell transistors connected to a selected one of said word lines in a selected one of said memory blocks for applying a first voltage and pass voltages to said selected word line and the remaining unselected word lines in said selected memory block, respectively, to transfer a voltage on the bit line connected to said selected memory cell transistor to the drain of said selected memory cell transistor, and then applying a second voltage to the boosting line associated with said selected word line such that said selected memory cell transistor is programmed by capacitive coupling of said second voltage onto said selected word line.

* * * * *